(12) United States Patent
Suzuki et al.

(10) Patent No.: US 7,276,908 B2
(45) Date of Patent: Oct. 2, 2007

(54) MAGNETIC RESONANCE IMAGING APPARATUS WITH SUPPRESSED NOISE

(75) Inventors: Kunihito Suzuki, Hitachinaka (JP);
Hirofumi Motoshiromizu, Ishioka (JP);
Kunihiro Takayama, Hitachi (JP);
Yoshihide Wadayama, Hitachiota (JP);
Akira Kurome, Kashiwa (JP); Shin Hoshino, Nagareyama (JP)

(73) Assignees: Hitachi, Ltd., Tokyo (JP); Hitachi Medical Corporation, Tokyo (JP); Hitachi Engineering Co., Ltd., Hitachi-shi (JP)

(*) Notice: Subject to any disclaimer, the term of this patent is extended or adjusted under 35 U.S.C. 154(b) by 0 days.

(21) Appl. No.: 11/159,238

(22) Filed: Jun. 23, 2005

(65) Prior Publication Data

US 2005/0285596 A1    Dec. 29, 2005

(30) Foreign Application Priority Data

Jun. 23, 2004  (JP) ............................ 2004-184382
Jun. 10, 2005  (JP) ............................ 2005-170956

(51) Int. Cl.
*G01V 3/00* (2006.01)
(52) U.S. Cl. ..................................... 324/318
(58) Field of Classification Search ................. 324/318
See application file for complete search history.

(56) References Cited

U.S. PATENT DOCUMENTS

| | | | |
|---|---|---|---|
| 5,381,122 A * | 1/1995 | Laskaris et al. | 335/216 |
| 6,404,200 B1 * | 6/2002 | Dietz et al. | 324/318 |
| 6,437,672 B1 * | 8/2002 | Takeshima et al. | 335/216 |
| 6,504,372 B1 | 1/2003 | Cline | |
| 6,516,282 B2 * | 2/2003 | Hedlund et al. | 702/132 |
| 6,567,685 B2 * | 5/2003 | Takamori et al. | 600/410 |
| 6,847,279 B2 * | 1/2005 | Yoshida et al. | 335/301 |
| 7,049,920 B2 * | 5/2006 | Yoshino et al. | 335/301 |

FOREIGN PATENT DOCUMENTS

| | | |
|---|---|---|
| JP | 09-289982 | 11/1997 |
| JP | 2000-139874 | 5/2000 |
| JP | 2002-017709 | 1/2002 |
| JP | 2002-052004 | 2/2002 |
| JP | 2002-085371 | 3/2002 |
| JP | 2003-153873 | 5/2003 |
| JP | 2003-220050 | 8/2003 |
| JP | 2003-235824 | 8/2003 |
| JP | 2004-283274 | 10/2004 |
| WO | 01/74243 | 10/2001 |

* cited by examiner

*Primary Examiner*—Brij Shrivastav
*Assistant Examiner*—Dixomara Vargas
(74) *Attorney, Agent, or Firm*—Mattingly, Stanger, Malur & Brundidge, P.C.

(57) ABSTRACT

In the MRI apparatus of the present invention, a reinforcing member is firmly provided so as to enhance the rigidity strength of two connecting tubes connecting upper and lower cryostats, thereby suppression of vibration caused by a gradient magnetic field coil and suppression of variation of static magnetic field can be realized. Further, in the MRI apparatus of the present invention, the reinforcing member is provided in upper and lower portions of the connecting tubes of the vacuum vessels, thereby suppression of vibration caused by the gradient magnetic field coil and suppression of variation of static magnetic field can be realized. Further, in the MRI apparatus of the present invention, the reinforcing member is provided in upper and lower parts of the vacuum vessels, thereby suppression of vibration caused by the gradient magnetic field coil and suppression of variation of static magnetic field can be realized.

12 Claims, 11 Drawing Sheets

Page number: US 7,276,908 B2

MAGNETIC RESONANCE IMAGING APPARATUS WITH SUPPRESSED NOISE

CLAIM OF PRIORITY

The present application claims priority from Japanese application serial no. 2004-184382, filed on Jun. 23, 2004, and Japanese application serial no. 2005-170956, filed on Jun. 10 2005, the contents of which are hereby incorporated by references into this application.

BACKGROUND OF THE INVENTION

The present invention relates to a magnetic resonance imaging (hereinafter referred to as an "MRI") apparatus, and more particularly, to a structure of the MRI apparatus for suppressing variations of a static magnetic field and noise of the apparatus.

In the MRI apparatus, a pulse electric current is applied to a gradient magnetic field coil (hereinafter referred to as a "GC") to generate a gradient magnetic field. Since the GC is located in a static magnetic field, Lorentz force acts on the conductor of the GC where the pulse electric current flows, thereby GC vibration is caused. The GC vibration reaches through a support structural member and the like to a static magnetic-field generation source to vibrate the static magnetic-field generation source. The generated micron-order vibration of the static magnetic-field generation source varies the static magnetic field with time, and as a result, adversely affects an MR image. Further, the GC vibration causes aerial vibration, i.e., noise, to increase a patient's feeling of anxiety, and further, disturbs communication between the patient and an operator. Patent Document 1 (Japanese Patent Laid-Open No. 2003-220050) discloses an example of MRI apparatus having a structure for suppressing the GC vibration. According to the structure, a coil container is reinforced such that the rigidity of the coil vessel is increased, thereby the vibration of the coil and magnetic poles can be reduced. Further, as another example, in an apparatus described in Patent Document 2 (Japanese Patent Laid-Open No. 2002-85371), the GC, which is the vibration generation source, is accommodated in a vacuum vessel, and a vibration damping member is used as the GC support member to suppressing the vibration.

In the structure of the MRI apparatus shown in the Patent Document 1, as the coil vessel is reinforced, the vibration caused therein can be suppressed up to a point but the vibration caused in the vacuum container cannot be suppressed without difficulty.

In the superconductive magnet apparatus shown in the Patent Document 2, as the air-propagating vibration is reduced by evacuation around the GC and a damping mechanism is utilized in the GC support member, the reduction of vibration and noise can be realized. However, in the structure, the vibration from the GC is transmitted via the GC support member to the outside, and at last, the vibration from the GC cannot be suppressed without difficulty.

In comparison with these conventional techniques, the present invention has an object to provide an MRI apparatus where variation of static magnetic field and noise due to GC vibration can be suppressed sufficiently.

SUMMARY OF THE INVENTION

To attain the above object, the present invention provides a magnetic resonance imaging apparatus comprising: a pair of superconductive coils; a pair of coil vessels respectively holding the superconductive coils with coolant; a pair of vacuum vessels respectively accommodating the coil vessels, disposed in upper and lower positions; and two or more tubes connecting the upper and lower vacuum vessels each other, wherein the apparatus further comprises a reinforcing member to increase the rigidity of an assembly including the vacuum vessels and connecting tubes.

In this case, the reinforcing member can be provided on at least one of the connecting tubes. Otherwise, the reinforcing member can be provided on an outer surface of the vacuum vessel in a position where the connecting tube is connected. Further, the reinforcing member can be integrally provided over an outer surface of at least one of the connecting tubes and outer surface of at least one of the vacuum vessels in a position where at least one of said connecting tube is connected. Further, the reinforcing member can be provided on at least the upper vacuum vessel. Further, these reinforcing members can be combined.

Further, it is preferable that the reinforcing member has a shape asymmetric with respect to a horizontal plane between the pair of superconductive coils.

Further, to attain the above object, the present invention provides a magnetic resonance imaging apparatus comprising: a pair of superconductive coils; a pair of coil vessels respectively holding the superconductive coils with coolant; and a pair of vacuum vessels respectively accommodating the coil vessels, provided in upper and lower positions, wherein the upper and lower vacuum vessels have a gradient magnetic-field generating coil, and the apparatus has a vibration suppression structure by which vibration from the gradient magnetic-field generating coil is not transmitted to the other vacuum vessel.

According to the present invention, as the variations of static magnetic field due to GC vibration can be suppressed, a high-quality image can be obtained. Further, reduction of the noise which is air-propagating vibration due to the GC vibration can also be realized.

DETAILED DESCRIPTION OF THE INVENTION

Hereinafter, embodiments of the present invention will be described in accordance with the drawings.

Figure 11:
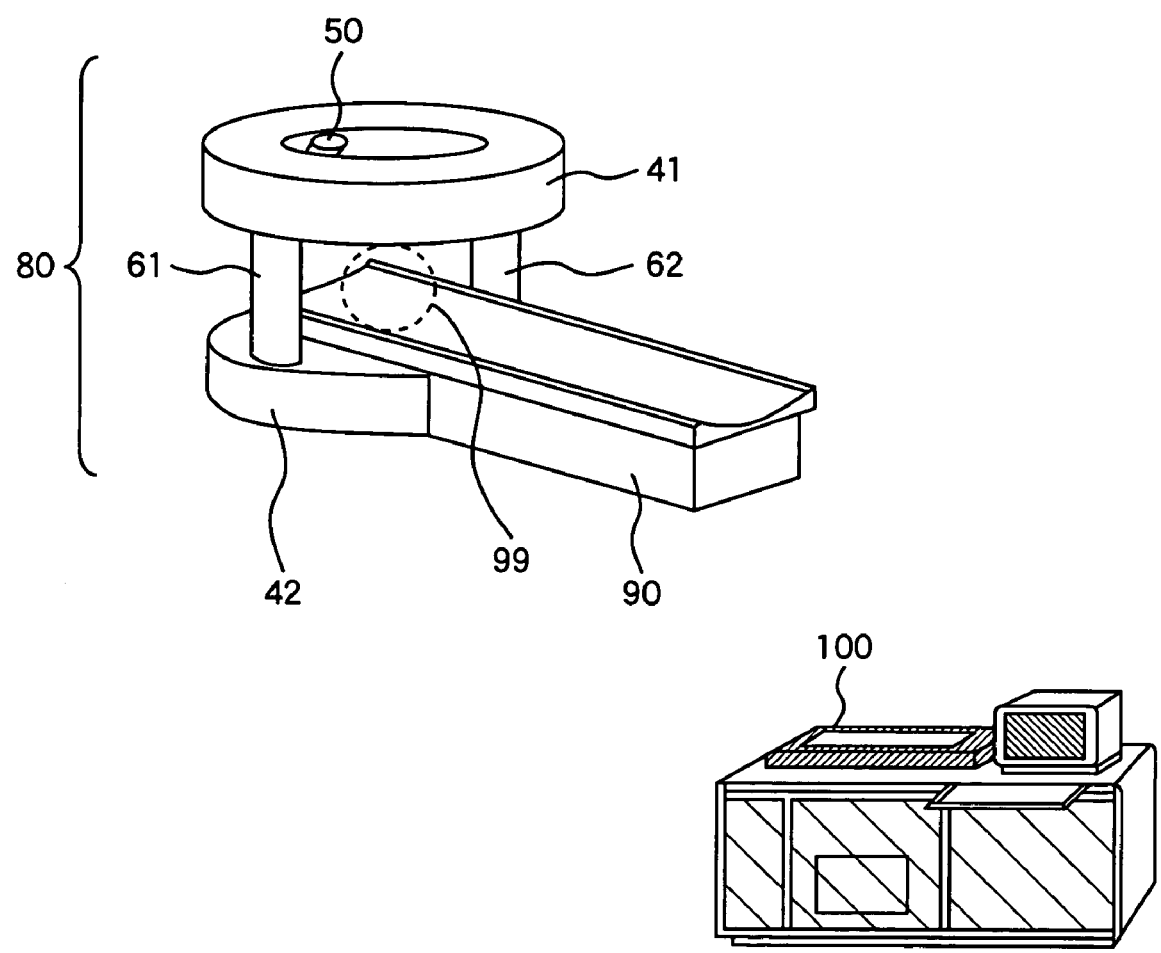
FIG. 11 is a perspective external view of the magnetic resonance imaging apparatus to which the present invention is applicable.

FIG. 11 shows a schematic construction of an MRI apparatus to which the present invention is applicable. As shown in the figure, the MRI apparatus is broadly divided into a superconductive magnet device 80, a bed 90 on which a patient is placed, and a control device 100 to analyze nuclear magnetic resonance signals from the patient. The superconductive magnet device 80 comprises a superconductive coils (not shown in FIG. 11), coil vessels (not shown in FIG. 11) holding the superconductive coils with coolant, vacuum vessels 41 and 42 accommodating respectively the coil vessels and holding a vacuum state inside, connecting tubes 61 and 62 provided, with image sensing space 99 therebetween, so as to connect the upper and lower coil vessels to be coolant communication tubes, and a cryocooler 50 for cooling the coolant. The vacuum vessels 41 and 42 are provided in opposing positions away from each other, and vertical magnetic field space is formed between the vacuum vessels 41 and 42, so as to carry out tomography on the patient on the bed 90. Hereinafter, embodiments of the MRI apparatus to which the present invention is applied will be described.

EMBODIMENT 1

Figure 1:
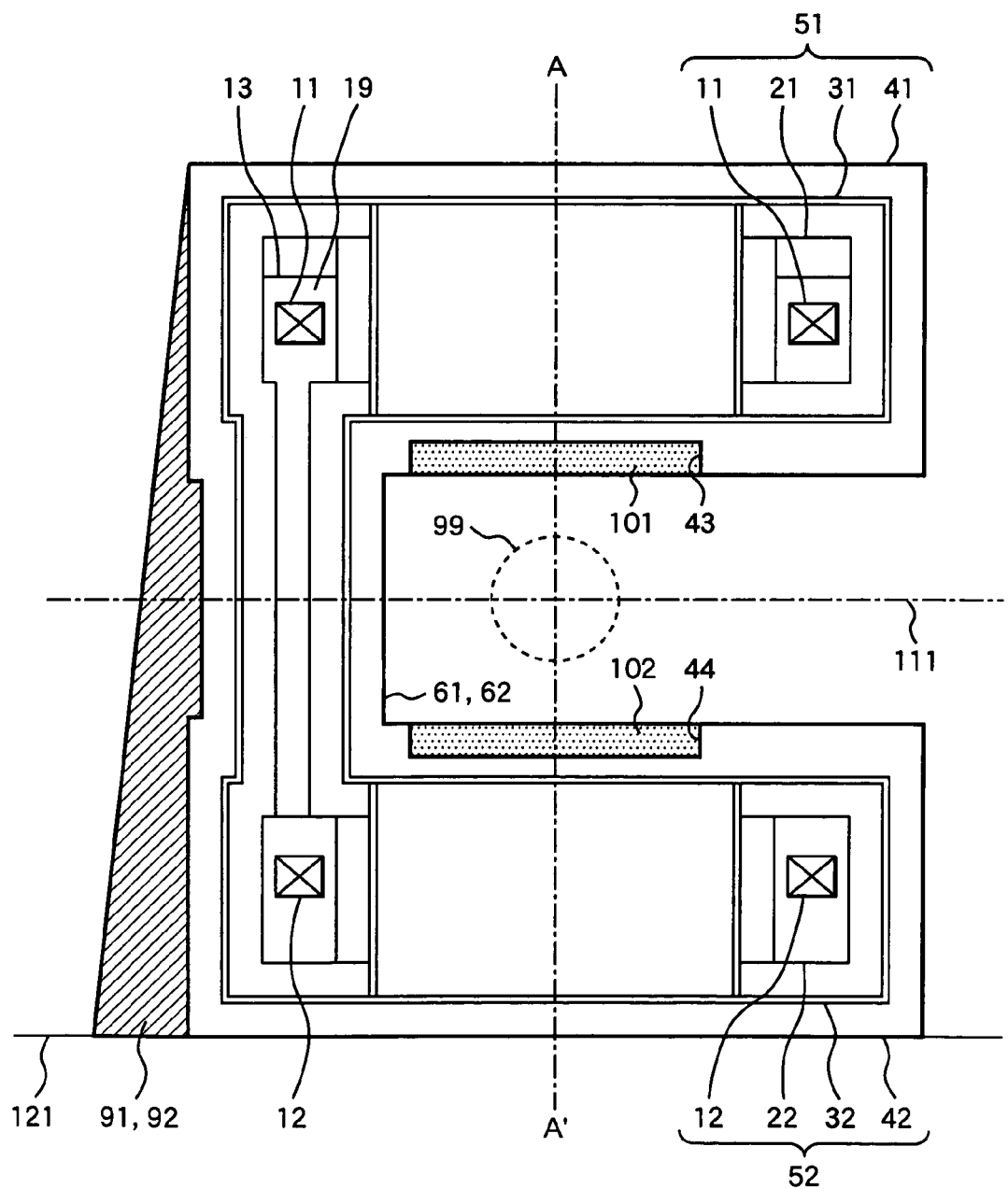
FIG. 1 is a cross-sectional view showing a embodiment of the magnetic resonance imaging apparatus of the present invention.

FIG. 1 shows a cross sectional view of the MRI apparatus as a first embodiment of the present invention. The superconductive magnet device 80 of the present embodiment comprises cryostats 51 and 52, and the connecting tubes 61 and 62 connecting the cryostats 51 and 52. The cryostats 51 and 52 are composed of superconductive coils 11 and 12 as annular ring coils to which a predetermined electric current is applied so as to generate a static magnetic field; annular cylindrical coil vessels 21 and 22 holding the superconductive coils with coolant liquid He; annular cylindrical heat shields 31 and 32 accommodating the coil vessels; and the annular cylindrical vacuum vessels 41 and 42 accommodating the coil vessels 21, 22 and the heat shields 31, 32 and holding a vacuum state inside. The cryostats 51 and 52 are provided in mutually opposing positions. The cryostat 52 is fixed to a floor surface 121 with a bolt via a fixing member (illustration omitted). Further, reference numeral 13 in the figure denotes a coolant liquid level.

FIG. 1, the left half part of the cross section to a central axis A-A' shows a cross section in a portion where the connecting tubes 61 and 62 are positioned. The right half part of the cross section to the central axis A-A' shows a cross section in a portion where the connecting tube 61 and 62 are absent.

The vacuum vessels 41 and 42 respectively have opposed concave portions 43 and 44 to which GCs 101 and 102 are fitted.

Further, beam-like reinforcing members 91 and 92 are attached to from the outer surface of the upper vacuum vessel 41 through the outer surface of the connecting tube 61 and 62 to the outer surface of the lower vacuum vessel 42. The reinforcing members 91 and 92 have a shape asymmetrical with respect to a horizontal plane 111 passing through the center of the image sensing space 99 between the upper and lower superconductive coils.

A series of reinforcing members 91 and 92 can be integrally formed with the part of the upper vacuum vessel 41, the parts of the connecting tubes 61 and 62, and the part of the lower vacuum vessel 42 by welding or the like. Further, the reinforcing members may be removably formed.

Figure 2:
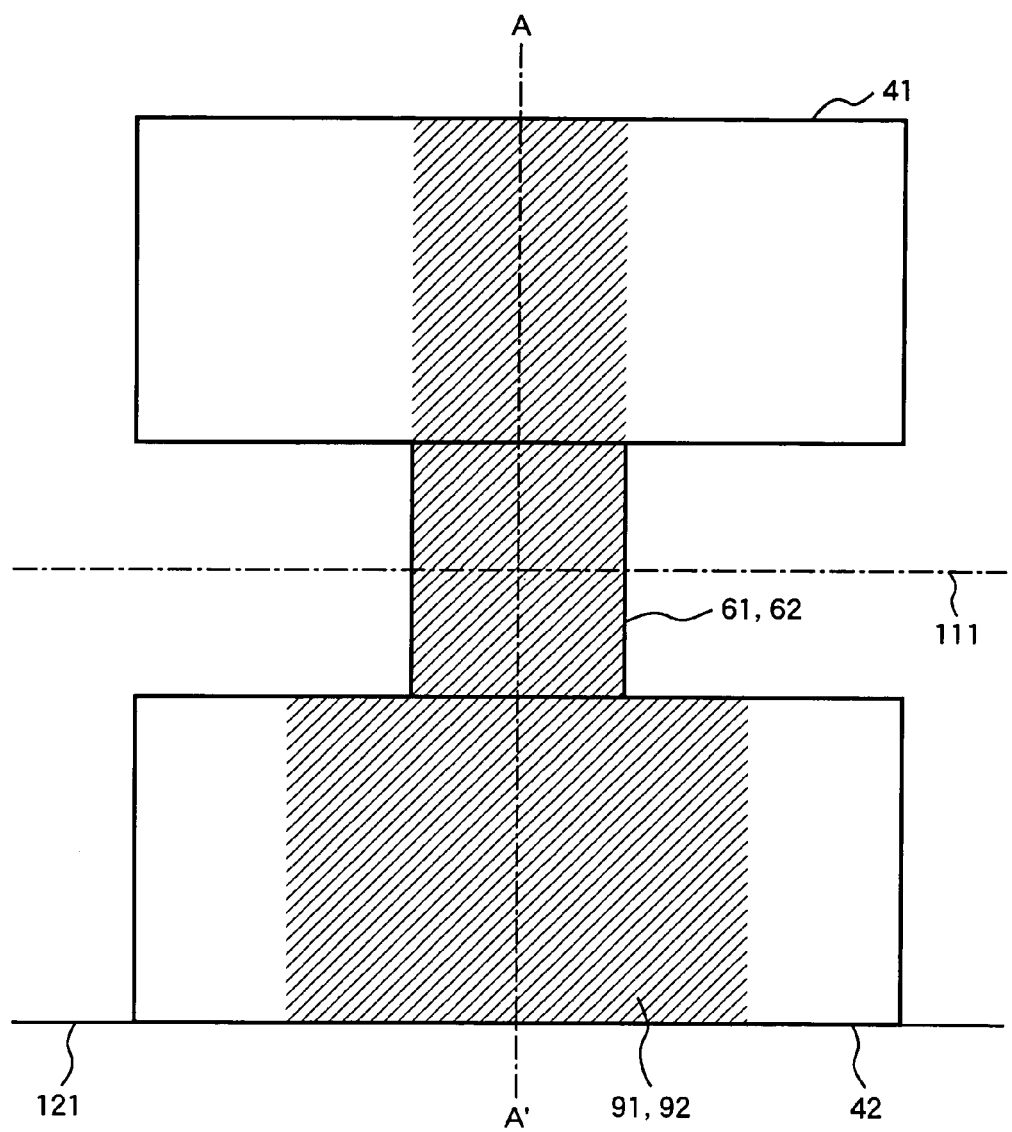
FIG. 2 is a diagram of the apparatus in FIG. 1 viewed from a horizontal direction.

FIG. 2 shows an example of the MRI apparatus of the present invention viewed from a horizontal direction to the reinforcing members 91 and 92. As shown in FIG. 2, the shape of an end portion of the reinforcing members 91 and 92 close to the floor 121 is larger than the other portions, while that of the upper vacuum vessel 41 is smaller than the other portions such that the upper and lower portions of the reinforcing members 91 and 92 are asymmetric with respect to the horizontal plane 111. Further the wall thickness varies in a vertical direction so that its thickness increases gradually from the top toward the bottom as shown in FIG. 1. As the material of these reinforcing members 91 and 92, non-magnetic stainless steel (hereinafter, referred to as "SUS"), aluminum, copper or the like can be used.

In the above structure, when vibration occurs in the GC 101 attached to the vacuum vessel 41 due to Lorentz force, the vibration is transmitted to the vacuum vessel 41 and transmitted to the vacuum vessel 42 through the connecting tubes 61 and 62 and to the floor 121. At this time, since integrally-formed beam-like reinforcing members 91 and 92 are provided in a series of portions from the vacuum vessel 41 through the connecting tubes 61 and 62 to the vacuum vessel 42, thereby the rigidity of the structure is increased. In flexural rigidity (Young's modulus×second moment of area) to a vibration mode of the vacuum vessel 41 to sway with reference to the structure's end fixed on the floor 121, the second moment of area increases. Further, in a case where the other parameters, i.e. the damping ratio, the mass, the Lorentz force and the like are the same conditions as usual, since the flexural rigidity and the vibration amplitude are in inversely proportional relation, the vibration amplitude of the vacuum vessel 41 due to the vibration of the GC 101 can be reduced. Especially, the upper and lower parts of the reinforcing members 91 and 92 have an asymmetric shape each other with respect to the horizontal plane 111, so that the lower part (the side of the fixed end) of the reinforcing members close to the floor 121 is wider and thicker than the other parts. In this manner, as the portion (upper part) of the reinforcing member close to the free end is narrower and thinner in comparison with the reinforcing member (lower part) close to the fixed end. Consequently unnecessary reinforcement is avoided, and reinforcement with excellent balance between rigidity and mass, like a beam which is also called beam of uniform strength or equivalent beam, can be realized. The beam of uniform strength or equivalent beam means the following beam. As maximum bending stress is proportional to bending moment and inversely proportional to a section modulus, the numerical value of normal bending moment varies in accordance with distance from the fixed end. In contrast to this, if the section modulus is also varied in correspondence with numerical value change of the bending moment, it is possible to determine the section modulus such that the maximum bending stress always occurs in every cross section. The beam of uniform strength or equivalent beam means a beam having always such maximum bending stress in every cross section.

According to the present embodiment, as the rigidity of coupled assembly including the connecting tubes 61,62 and the vacuum vessels 41,42 is increased by using the reinforcing members 91 and 92, the vibration of the vacuum vessels and the coil vessels due to the GC vibration can be suppressed. As a result, the vibration of the static magnetic-field generation source can be suppressed and the variation of the static magnetic field can be suppressed, and further, the noise due to the GC vibration can be suppressed.

Further, as the balance of reinforcement in the upper portion is different from that in the lower portion, the frequencies of natural vibration of the upper and lower vacuum vessels due to the rigidity differ from each other. As the upper and lower vacuum vessels do not easily resonate at the same frequency, the peak noise level is reduced. The details will be described as follows. Since the pulse electric current of the same several tens Hz to several hundreds Hz is applied to the upper and lower GCs 101 and 102, if only that, the vibration frequencies of the GCs 101 and 102 are the same. Further, generally, as the upper and lower vacuum vessels 41 and 42 are approximately symmetrically formed, the frequencies of natural vibration of the vacuum vessels 41 and 42 are approximately the same. However, according to the present embodiment, as the upper and lower shapes of the reinforcing members 91 and 92 are asymmetric with respect to the plane 111, there is a difference between the frequencies of natural vibration of the upper and lower vacuum vessels 41 and 42. As a result, the resonance points of the vacuum vessels 41 and 42 excited by the GCs 101 and 102 with the same vibration frequency are sifted from each other, accordingly, there is a difference between the levels of noise caused by the vacuum vessels 41 and 42 to the same vibration frequency, and the peak noise level as a whole can be suppressed.

Note that a concave member for installation of the cryocooler 50 as shown in FIG. 11 is not provided in the top plate of the upper vacuum vessel 41 in the present embodiment. This matter is merely a difference in designing, and the concave member can be provided in accordance with necessity as in the case of the MRI apparatus-in FIG. 11.

EMBODIMENT 2

Figure 3:
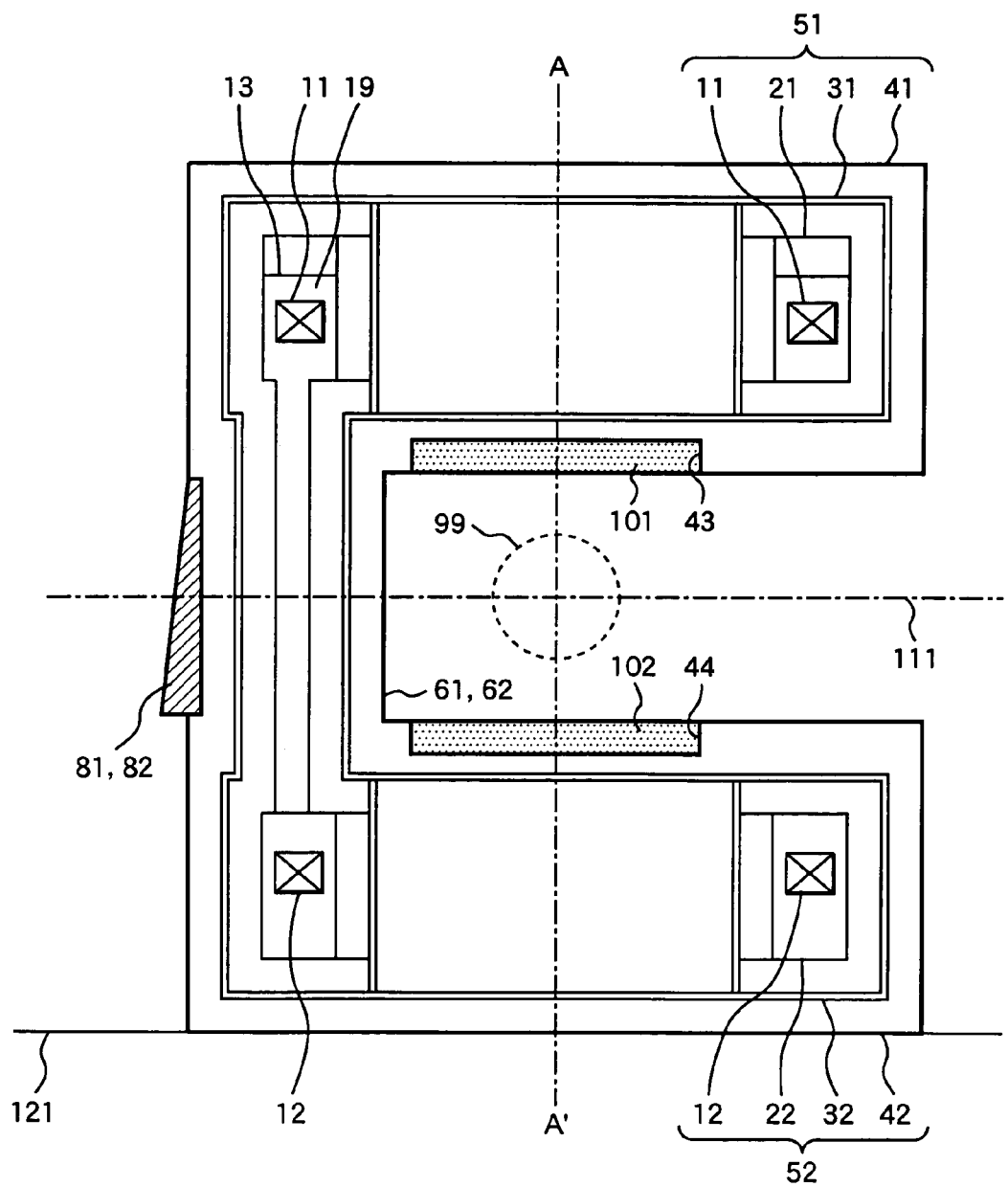
FIG. 3 is a cross-sectional view showing the second embodiment of the present invention.

FIG. 3 shows a second embodiment of the present invention. The difference between the present embodiment and the first embodiment is that reinforcing members 81 and 82, in place of the reinforcing members 91 and 92, are provided on only the connecting tubes 61 and 62. As shown in the figure, the shape of the lower part (an end side close to the lower vacuum vessel 42) of the reinforcing members 81 and 82 is large, while the upper part (an end side close to the upper vacuum vessel 41) is small such that the upper and lower parts of the reinforcing members 81 and 82 are asymmetric with respect to the plane 111. Especially, the lower part of reinforcing member is formed in a wide and thick shape, and the upper part of the same is formed in a narrower and thinner shape in comparison with the upper part. As the material of these reinforcing members 81 and 82, non-magnetic SUS, aluminum, copper or the like can be used as in the case of the first embodiment.

In the above structure, the rigidity of the connecting tubes 61 and 62 most effective on the connection rigidity with the cryostats 51 and 52 can be ensured. In a case where the rigidity of the vacuum vessels 41 and 42 is sufficient, GC vibration can be effectively reduced, and the vibration can be suppressed while the weight of the MRI apparatus is reduced to a minimum level.

Further, as the upper and lower parts of the reinforcing members 81 and 82 are formed asymmetrically to the plane 111, the frequencies of natural vibration of the upper and lower vacuum vessels 41 and 42 are shifted from each other, and the peak noise level can be suppressed.

EMBODIMENT 3

Figure 4:
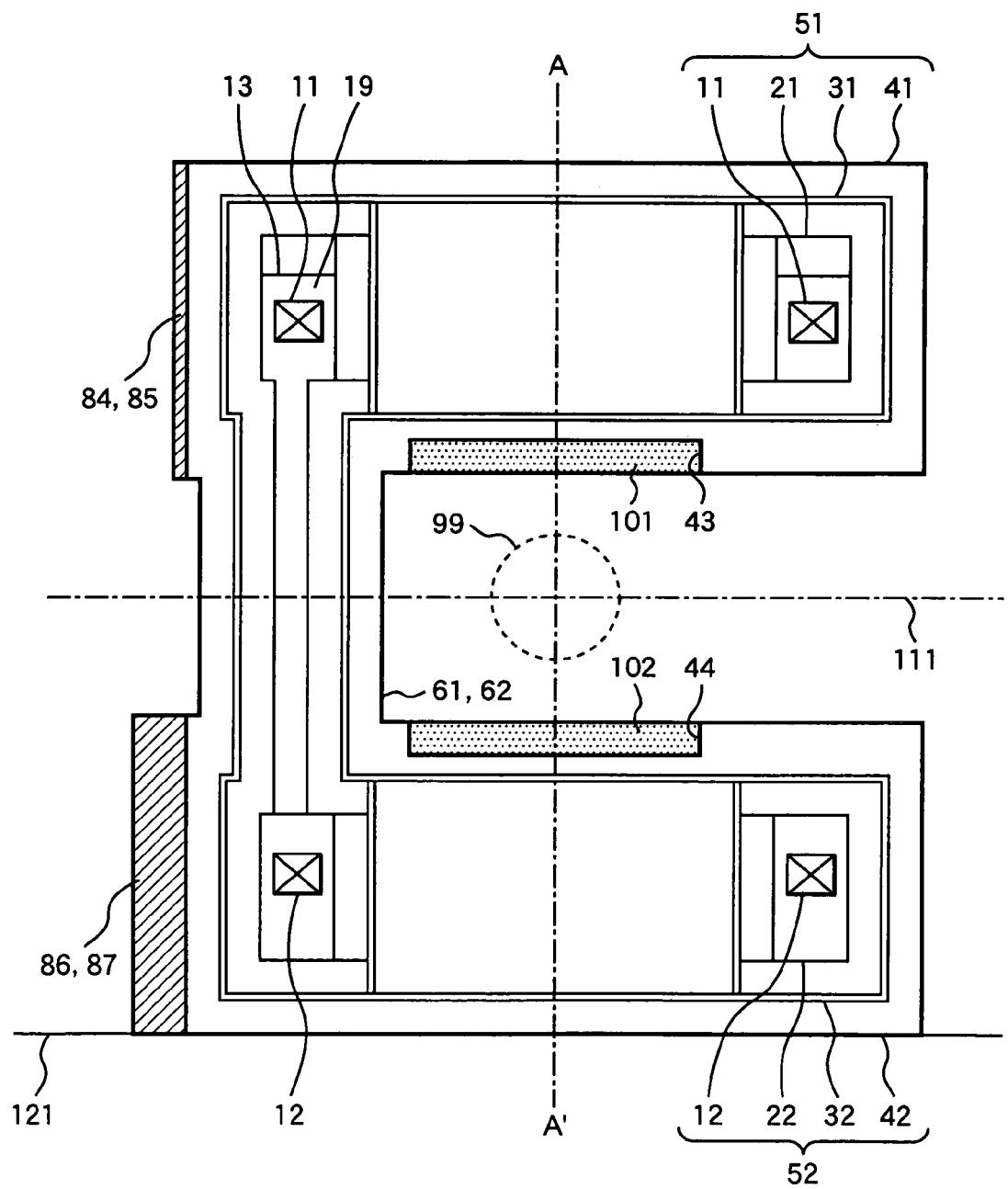
FIG. 4 is a cross-sectional view showing the third embodiment of the present invention.

FIG. 4 shows a third embodiment of the present invention. The difference between the present embodiment and the first embodiment is that, in place of the reinforcing members 91 and 92, vacuum vessel reinforcing members 84 and 85 are provided on the vacuum vessel 41 above the connecting tubes 61 and 62, and vacuum vessel reinforcing members 86 and 87 are provided on the vacuum vessel 42 below the connecting tubes 61 and 62.

As shown in the figure, the shape of the vacuum vessel reinforcing members 86 and 87 provided on the vacuum vessel 42 is large, and that of the vacuum vessel reinforcing members 86 and 87 provided on the vacuum vessel 41 is small. Especially, the vacuum vessel reinforcing members 86 and 87 are formed in a wide and thick shape, while the vacuum vessel reinforcing members 84 and 85 are formed in a narrower and thinner shape in comparison with the vacuum vessel reinforcing members 86 and 87. As the material of these vacuum vessel reinforcing members 84, 85, 86 and 87, non-magnetic SUS, aluminum, copper or the like can be used as in the case of the first embodiment.

In this structure, the rigidity of a portion in the vicinity of the connection between the vacuum vessel 41 and the connecting tubes 61 and 62, and the rigidity of a portion in the vicinity of the connection between the vacuum vessel 42 and the connecting tubes 61 and 62 increase, thereby the connection rigidity of the cryostats 51 and 52 can be ensured effectively. Accordingly, in a case where the rigidity of the connecting tubes 61 and 62 is sufficient, the reduction of GC vibration can be realized.

Further, as the shape of the vacuum vessel reinforcing members 84 and 85 and that of the vacuum vessel reinforcing members 86 and 87 are formed as asymmetric with respect to the plane 111, the frequencies of natural vibration of the upper and lower vacuum vessels 41 and 42 can be shifted from each other and the peak noise level can be suppressed.

EMBODIMENT 4

Figure 5:
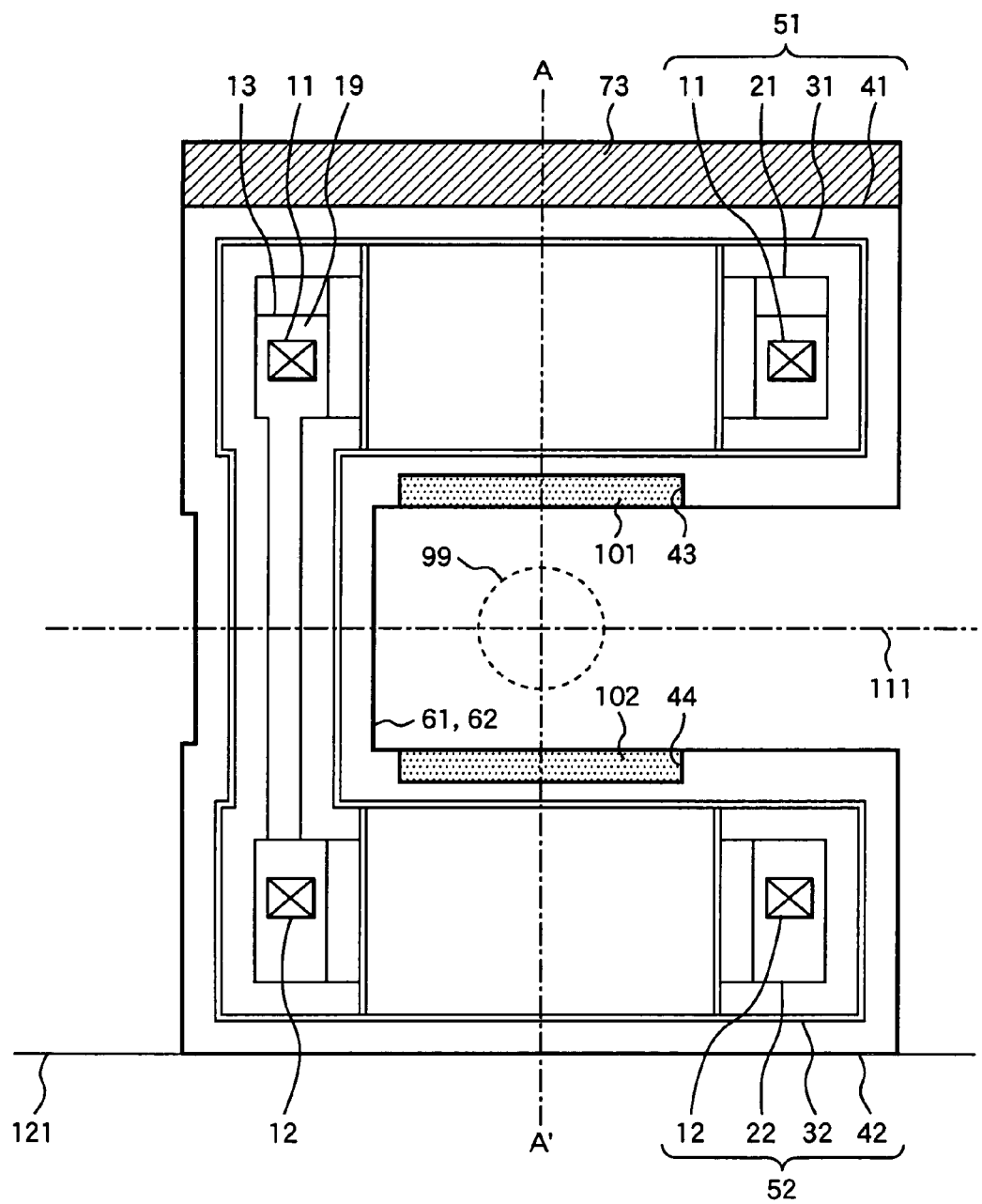
FIG. 5 is a cross-sectional view showing the fourth embodiment of the present invention.

FIG. 5 shows a fourth embodiment of the present invention. The difference between the present embodiment and the first embodiment is that, in place of the reinforcing members 91 and 92, a vacuum vessel reinforcing member 73 is provided on the upper side of the vacuum vessel 41. In this structure, as the rigidity of the vacuum vessel 41 to maintain the rigidity of the cryostats 51 and 52 can be effectively and laconically increased, when the rigidity of the connecting tubes 61 and 62 is sufficient, the reduction of GC vibration can be realized.

Further, as the vacuum vessel reinforcing member 73 is provided only on the top plate of the upper vacuum vessel 41, the reinforcing member is asymmetric with respect to the plane 111. The frequencies of natural vibration of the upper and lower vacuum vessels 41 and 42 can be effectively shifted from each other and the peak noise level can be further suppressed.

EMBODIMENT 5

Figure 6:
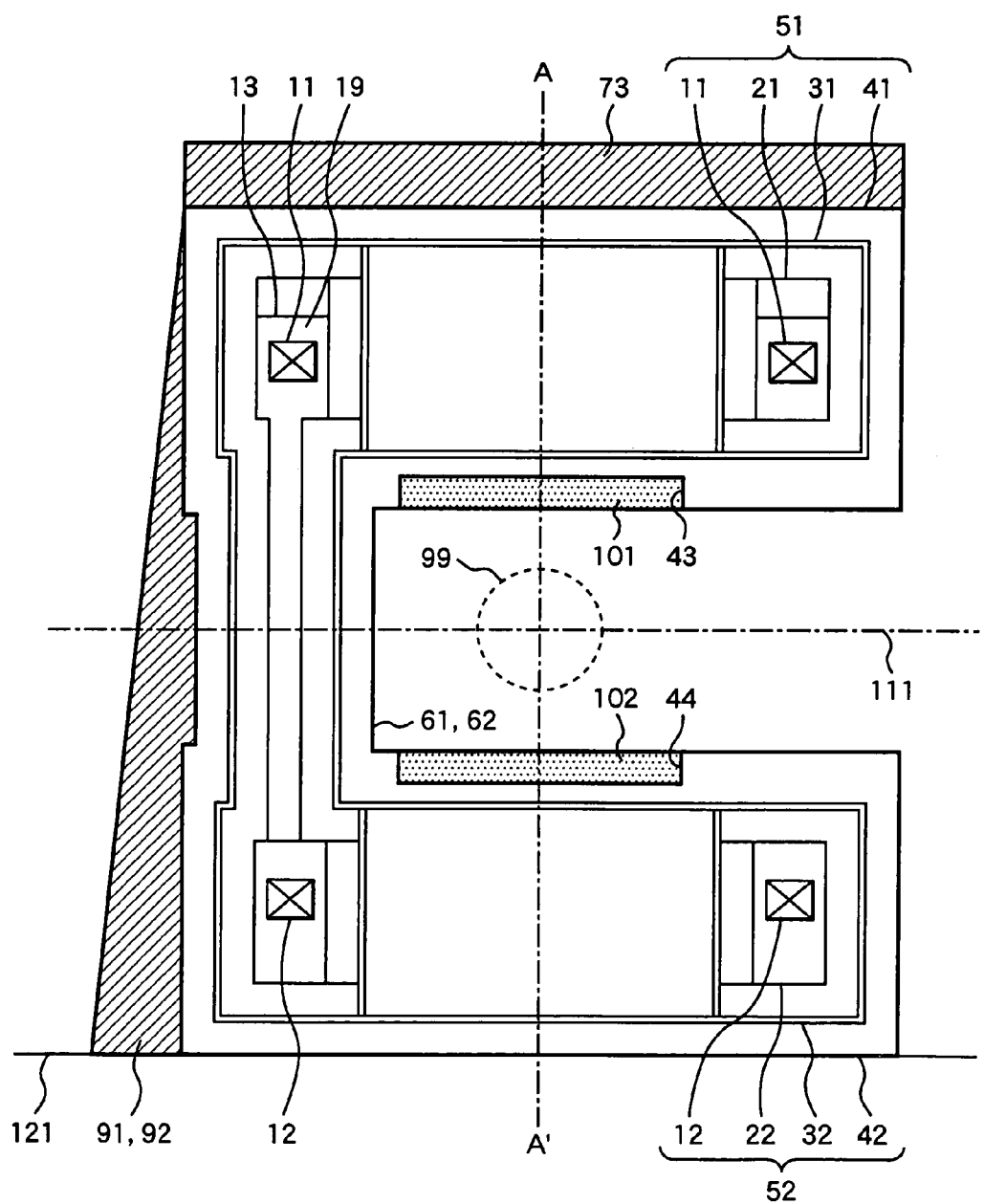
FIG. 6 is a cross-sectional view showing the fifth embodiment of the present invention.

FIG. 6 shows a fifth embodiment of the present invention. This embodiment is a combination of the first and the fourth embodiments. The vacuum vessel reinforcing member 73 is provided on the upper side of the vacuum vessel 41 for reinforcement of the upper side one of the vacuum vessels with respect to the horizontal plane 111. Further, the beam-like reinforcing members 91 and 92 are integrally provided from the upper vacuum vessel 41 through the connecting tube 61 to the lower vacuum vessel 42, and the reinforcing members 91 and 92 has a asymmetrical shape with respect to the plane 111.

Figure 7:
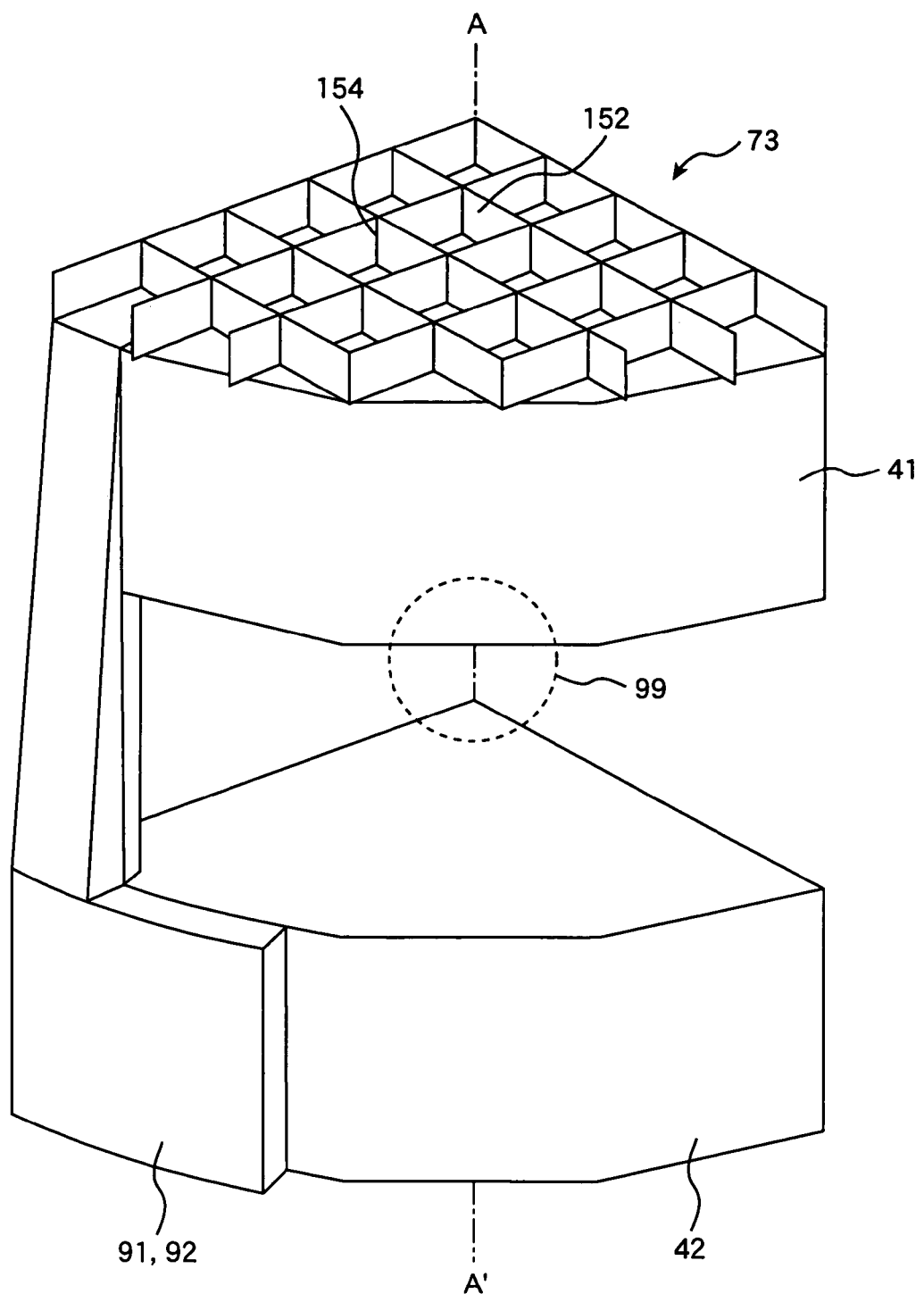
FIG. 7 is an external view of a part of the fifth embodiment of the present invention.

FIG. 7 shows a detailed external view of the vacuum vessel reinforcing member 73. FIG. 7 shows the external view of the ¼ of the apparatus shape viewed from a central axis A-A'. The vacuum vessel reinforcing member 73 is integrally formed by welding non-magnetic SUS plate members 152 and 154 interlaced in a grid-like shape. This vacuum vessel reinforcing member 73 is firmly joined with the top surface of the vacuum vessel 41 by welding or the like, thereby the enhancement of rigidity of the vacuum vessel 41 can be realized. Note that even if the SUS plate members are not used as the vacuum vessel reinforcing member 73, the reinforcing member can be formed with aluminum, copper or the like as long as the weight condition is satisfied.

Further, as shown in the first embodiment in FIG. 1, in the integral beam-like reinforcing members 91 and 92, the lower part in contact with vacuum vessel 42 is large while the upper part in contact with the vacuum vessel 41 is small such that the respective reinforcing members are asymmetric with respect to the plane 111. As the material of these reinforcing members 91 and 92, non-magnetic SUS, aluminum, copper or the like can be used.

According to the above structure, the rigidity of the vacuum vessels 41 and 42 increase, and in addition to such rigidity-increasing vacuum vessel, the rigidity of the connecting tubes 61 and 62 can increase. As the rigidity of the entire apparatus can be remarkably enhanced, the reduction of GC vibration can be realized.

Further, as the vacuum vessel reinforcing member 73 is provided on the top plate of the upper vacuum vessel 41, and the integral beam-like reinforcing members 91 and 92 are provided asymmetrically to the plane 111, the rigidity of the entire apparatus can be remarkably enhanced and the GC vibration can be suppressed so as to reduce noise. In addition, as the frequencies of natural vibration of the upper and lower vacuum vessels 41 and 42 can be effectively shifted from each other, the peak noise level can be further suppressed.

EMBODIMENT 6

Figure 8:
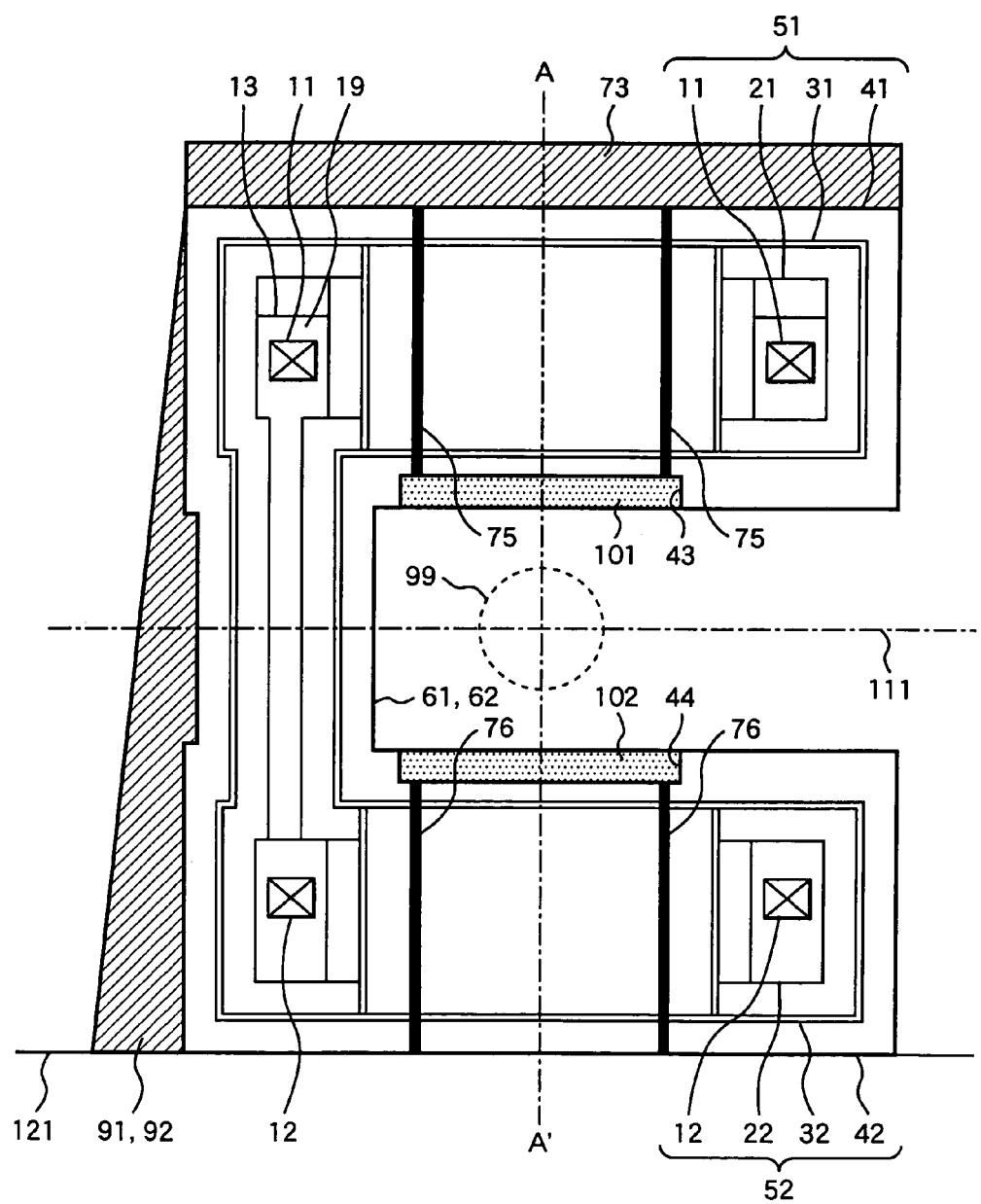
FIG. 8 is a cross-sectional view showing the sixth embodiment of the present invention.

FIG. 8 shows a sixth embodiment of the present invention. As the present embodiment, in the fifth embodiment, two or more support members 75 are provided between the GC 101 in the vacuum vessel 41 and the vacuum vessel reinforcing member 73 for connections with the GC 101 and reinforcing member 73. Further, two or more support members 76 are provided between the GC 102 in the vacuum vessel 42 and the bottom plate of the vacuum vessel 42 for connections with the GC 102 and bottom plate. In this structure, even if the rigidities of the vacuum vessel 41 in the vicinity of the GC 101 and the vacuum vessel 42 in the vicinity of the GC 102 are low, the GCs 101 and 102 can be attached to the reinforcing member 73 and the floor 121 through the support members 75 and 76 while the rigidity is enhanced. Therefore, even when vibration occurs by the GCs, the vibration is not easily transmitted to the vacuum vessels 41 and 42. Accordingly, the vibration of the static magnetic field can be further reduced.

EMBODIMENT 7

Figure 9:
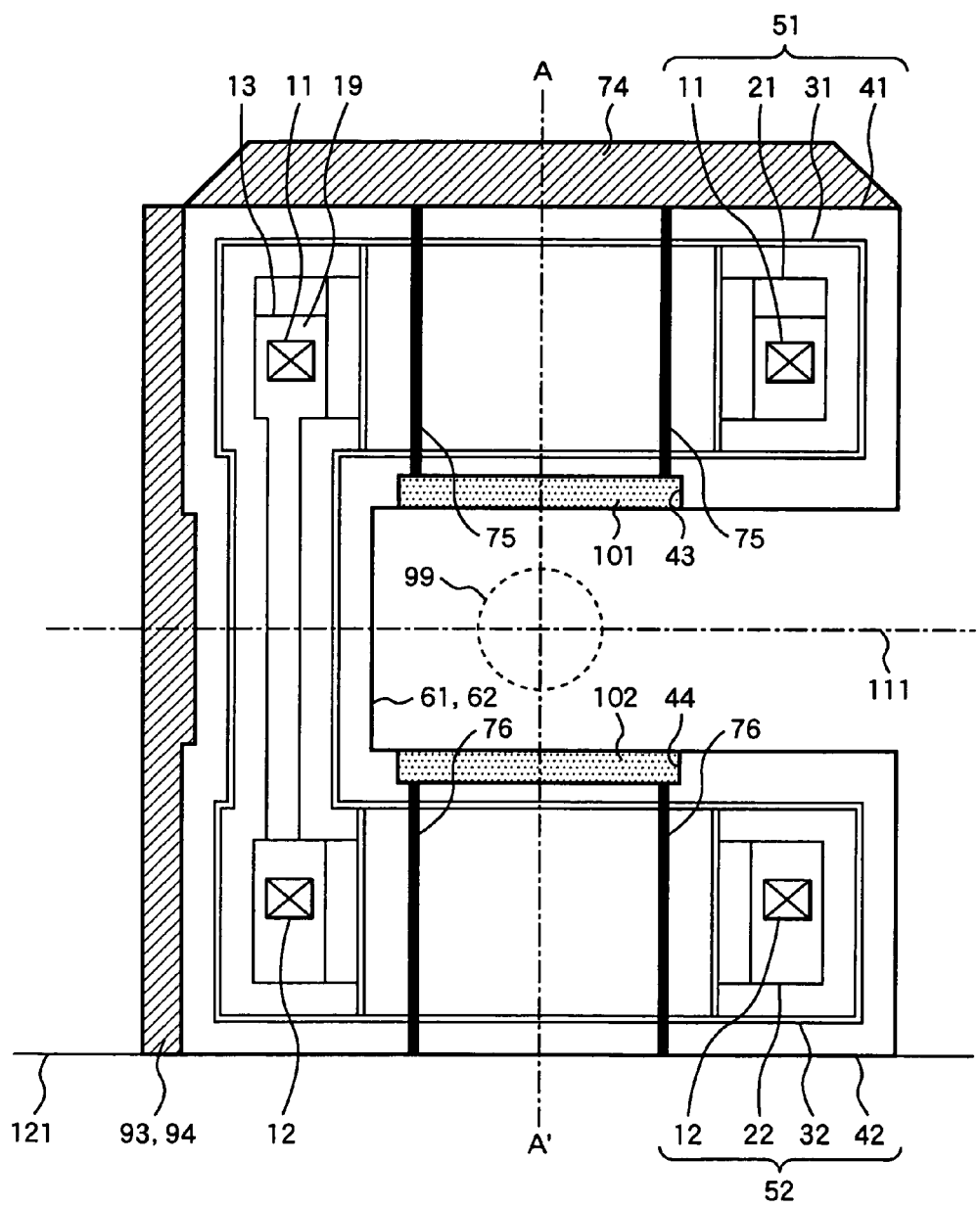
FIG. 9 is an external view of apart of the seventh embodiment of the present invention.
Figure 10:
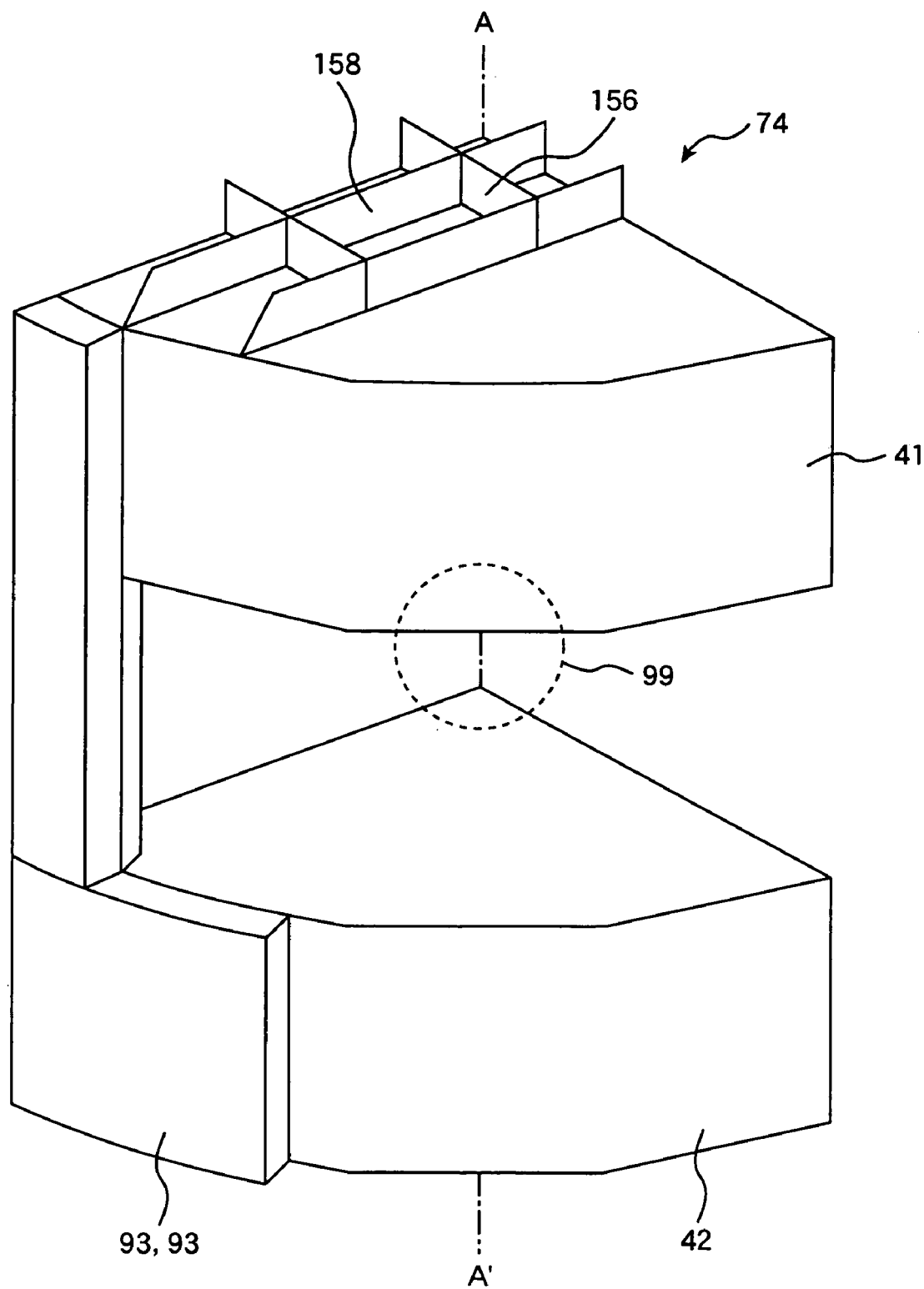
FIG. 10 is a cross-sectional view showing the seventh embodiment of the present invention.

FIGS. 9 and 10 show a seventh embodiment of the present invention. The present embodiment is a modification to the fifth embodiment shown in FIGS. 6 and 7. The difference between the present embodiment and the embodiment in FIG. 8 is that the structure of the vacuum vessel reinforcing member 73 and the structure of the beam-like reinforcing members 91 and 92 are changed. Note that FIG. 9 shows the external view of the ¼ of the apparatus shape viewed from the central axis A-A' as in the case of FIG. 7.

In the present embodiment, instead of the previously mentioned gradually increasing-thickness beam-like reinforcing members 91 and 92 provided on the connecting tubes 61 and 62, beam-like reinforcing members 93 and 94 are formed with plural plate members having different thicknesses. That is, as shown in FIG. 9, the outer surface of the respective connecting tubes 61 and 62 are provided with concave portions. A part of each beam-like reinforcing member 93 (94) is positioned in the concave portion between the upper and lower vacuum vessels 41 and 42. The part of each reinforcing member 93 (94) in the concave portion is thicker than the other parts. However, all outer surfaces of the beam-like reinforcing members 93 and 94 are flat-top shaped. Further, as shown in FIG. 10, the width of the beam-like reinforcing members 93 and 94 in a circumferential direction of the lower vacuum vessel 42 is wide, and that in a circumferential direction of the connecting tubes 61 and 62 and the upper vacuum vessel 41 is narrow. Thus the reinforcing members are formed asymmetrically with respect to the plane 111.

Further, as in the case of FIG. 7, the vacuum vessel reinforcing member 74 is formed in a grid-like shape by interlacing non-magnetic SUS plate members 156 and 158 integrally with welding. However, the reinforcing member is not provided on the entire top plate of the vacuum vessel 41, but is formed in a beam-like shape between positions where a pair of connecting tubes 61 and 62 are connected. Note that the vacuum vessel reinforcing member 74 can be formed with, not the SUS plates, but aluminum, copper or the like as long as the weight condition is satisfied.

In this structure, according to the present embodiment, the same effects as those in the fifth embodiment can be obtained, and further, as the beam-like reinforcing members 93 and 94 can be formed by combining plate members, the manufacturing can be facilitated. Further, the vacuum vessel reinforcing member 74 can be light-weighted.

In the above-described embodiments, the structures of the MRI apparatus using superconductive coils are shown, however, the present invention is applicable to an MRI apparatus using permanent magnets in place of the superconductive coils. In the MRI apparatus of this case, the vibration of static magnetic field can be suppressed as much as possible.

Further, in the MRI apparatus in the above-described embodiments, two connecting tubes are provided in 180-degree opposite positions for enhancement of the rigidity of the entire apparatus and reduction of vibration. The present invention is applicable to MRI apparatuses having other structures. For example, the invention is applicable to two connecting tubes provided in positions other than the 180-degree opposite positions. Further, the invention is applicable to a single, or three or more connecting tubes. In a case where three or more connecting tubes are used, the rigidity of apparatus can be enhanced and the vibration can be reduced by applying the present invention to even a structure where the connecting tubes are not provided with an equal pitch.

Further, in the MRI apparatus of the above-described embodiments, the reinforcing members are provided on the two connecting tubes, however, the present invention is not limited to this number of connecting tubes. The effects of the present invention can be obtained by providing the reinforcing member on at least one connecting tube.

What is claimed is:

1. A magnetic resonance imaging apparatus comprising:
    a pair of superconductive coils arranged so as to be across an imaging sensing space from each other;
    a pair of coil vessels respectively holding the superconductive coils with coolant;
    a pair of vacuum vessels respectively accommodating the coil vessels;
    at least one tube connecting the pair of vacuum vessels to each other,
    a reinforcing member to increase the rigidity of a coupled assembly configured by the vacuum vessels and said at least one connecting tube,
    wherein said reinforcing member has a shape asymmetric with respect to a horizontal plane between said pair of superconductive coils.

2. The magnetic resonance imaging apparatus according to claim 1, wherein said reinforcing member is provided on said connecting tube.

3. The magnetic resonance imaging apparatus according to claim 1, wherein said reinforcing member is integrally provided over an outer surface of said connecting tube and an outer surface of at least one of said pair of vacuum vessels.

4. The magnetic resonance imaging apparatus according to claim 1, wherein said reinforcing member is provided on at least said pair of vacuum vessels.

5. The magnetic resonance imaging apparatus according to claim 1, wherein said reinforcing member is provided on at least a top plate of said pair of vacuum vessels.

6. The magnetic resonance imaging apparatus according to claim 5, wherein each of said pair of vacuum vessels has a gradient magnetic-field generating coil, and wherein said apparatus further has a first support member connecting said reinforcing member provided on said top plate of said pair of vacuum vessels and one of the gradient magnetic-field generating coils to each other.

7. The magnetic resonance imaging apparatus according to claim 6, further comprising support members connecting a bottom plate of said pair of vacuum vessels and another of the gradient magnetic-field generating coils to each other.

8. The magnetic resonance imaging apparatus according to claim 5, wherein said reinforcing member provided on said top plate of said pair of vacuum vessels is formed by interlacing plate members in a grid-like shape.

9. The magnetic resonance imaging apparatus according to claim 5, further comprising two of said connecting tubes, wherein said reinforcing member is arranged like a beam over the top plate of said pair of vacuum vessels and said two connecting tubes.

10. The magnetic resonance imaging apparatus according to claim 1, wherein said reinforcing member is a non-magnetic member.

11. The magnetic resonance imaging apparatus according to claim 1, wherein said reinforcing member is configured so that a floor side thereof is larger than the other side thereof.

12. A magnetic resonance imaging apparatus comprising:
    a pair of superconductive coils arranged so as to be across an image sensing space from each other;
    a pair of coil vessels respectively holding the superconductive coils with coolant;
    a pair of vacuum vessels respectively accommodating the coil vessels;
    at least one tube connecting the pair of vacuum vessels to each other, and
    a reinforcing member to increase the rigidity of a coupled assembly configured by the vacuum vessels and said at least one connecting tube,
    wherein said reinforcing member is configured to make a difference between the frequencies of natural vibration of the vacuum vessels.

* * * * *